United States Patent [19]

Sainz

[11] Patent Number: 4,740,745
[45] Date of Patent: Apr. 26, 1988

[54] POLARITY AND CONTINUITY TESTER FOR PRIMARY AND SECONDARY AUTOMOTIVE CIRCUITS

[76] Inventor: Michael A. Sainz, 245 Lake Dr., San Bruno, Calif. 94066

[21] Appl. No.: 885,194

[22] Filed: Jul. 14, 1986

[51] Int. Cl.[4] .................... G01R 31/02; G01R 19/14
[52] U.S. Cl. .................................. 324/133; 324/503; 324/556; 324/384
[58] Field of Search ................ 324/51, 52, 133, 149, 324/72.5, 384, 390, 395; 340/660, 652; 307/127, 130

[56] References Cited

U.S. PATENT DOCUMENTS

| 4,005,362 | 1/1977 | Fortino | 324/725 X |
| 4,207,517 | 6/1980 | Bloxam | 324/133 X |
| 4,366,434 | 12/1982 | Ellis | 324/51 |
| 4,584,526 | 4/1986 | Lobastov | 324/133 |

*Primary Examiner*—Reinhard J. Eisenzopf
*Assistant Examiner*—Jack B. Harvey
*Attorney, Agent, or Firm*—Thomas M. Freiburger

[57] ABSTRACT

A polarity and continuity tester of simple construction identifies grounded and positive lead wires in an automobile and is also capable of confirming proper operation of high voltage spark wires, all with one simple circuit. A tri-color light emitting diode is included in the testing device, along with a ground wire, a tester battery, a resistor and a conductive point probe, all connected in series. When the ground wire is secured to ground in the automobile, the point probe when touched to grounded conductors will cause the light emitting diode to emit a first color such as green, with current flowing through the diode in a first direction under influence of the tester battery. When the point probe is touched to a hot lead above about 5 volts, the tester battery becomes merely a conductor, current flows in the opposite direction, and the light emitting diode emits a second color such as red. If the point probe is touched to a high voltage spark wire with the automobile's engine running, current will flow in the first direction and the first color will be emitted, confirming that the coil is properly connected and properly producing spark.

13 Claims, 2 Drawing Sheets

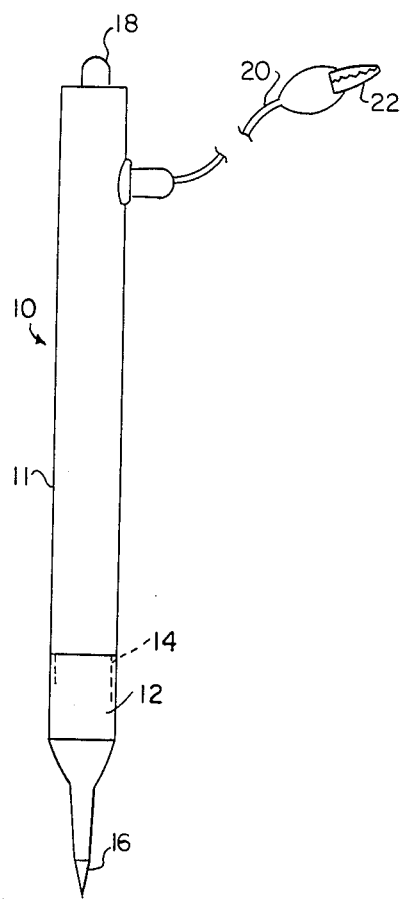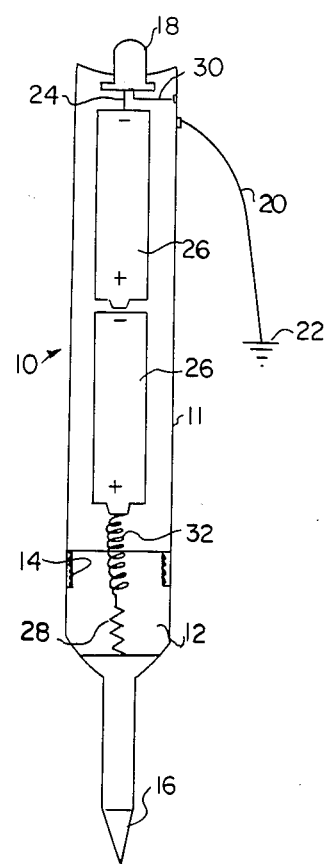
FIG. 1
FIG. 2

POLARITY AND CONTINUITY TESTER FOR PRIMARY AND SECONDARY AUTOMOTIVE CIRCUITS

BACKGROUND OF THE INVENTION

The invention relates to continuity and polarity testing apparatus, and more particularily to a tester principally for automotive use, employing a multi-colored light emitting diode capable of emitting different colors for different polarities.

Polarity and continuity testing devices, often in the form of a pencil shaped body with a point or probe at one end and a wire connectable to ground at the other end, have been well known. For example, see U.S. Pat. Nos. 3,964,039, 4,366,434, and 4,527,118.

U.S. Pat. No. 4,366,434 discloses a continuity checker and voltage detector utilizing two or three light emitting diodes for determining the polarity of the voltage with two of the diodes and for checking continuity with the third diode. The tester includes a DC bias source for the first and second light emitting diodes, and a DC supply for the third light emitting diode. In a principal embodiment, the patent includes two parallel circuits, one having a resistance, a battery, a light emitting diode and a rectifier diode, and the other having two separate batteries, two light emitting diodes and a resistance.

Although electrical testers such as disclosed in the above referenced U.S. Pat. No. 4,366,434 have been effective for limited purposes, they have included an unnecessarily high number of components and complexity of circuitry as compared to the present invention, and they have also been of limited capability in comparison to the present invention as described below.

SUMMARY OF THE INVENTION

The present invention is a continuity, polarity and voltage detector particularly for automotive use, having a very simple circuit and a unitarily packaged multi-color light emitting diode, with capability of checking continuity, plus or minus polarity and hot leads within the range of voltage of the automobile battery, and also proper operation of the automobile's high voltage sparks circuits.

In accordance with the invention, the electrical tester includes a generally pencil-shaped housing with a conductive point or needle type test point at one end and a ground lead extending from near the other end. A multi-color light emitting diode, under a single light-transmissive cover, is exposed at one end of the tester. In a single circuit in series in the tester are the ground lead, the light emitting diode (actually to back-to-back diodes of dissimilar colors), a battery preferably comprising two cells and three volts, a resistor and the probe point or needle. The resistor is matched to the light emitting diode and the tester battery in such a way that, when both the ground lead and the probe point are touched to the grounded conductors, the tester battery lights the diode in a first color, which may be green. With the ground lead connected to ground and the probe touched to a hot lead within the 12 volt range of operation of the automobile, current flows in the opposite direction using the tester battery only as a conductor, and the LED emits a second color, which may be red. When the probe is used to check the positive and negative primary circuit terminals of an automotive coil with the engine running, AC current is present to some degree at both terminals, producing a mixed color from yellow to orange. For example, when the negative coil terminal shows about 3 volts (at idle), green and red will mix to produce a yellowish color. Higher voltage at this terminal (engine at higher rpm) will move the color more toward orange or red. At the positive terminal of the coil, the color may vary from orange to red depending on rpm.

Another useful capability of the electrical tester of the invention is the ability to check for proper operation in the high voltage secondary spark wiring of the automobile, which is generally in the range of about 30,000 to 40,000 volts. The tester is capable of such testing by grounding of the ground lead and touching of the probe to high voltage secondary wiring such as spark plug lead wires with the automobile's engine running, without damage to the LED or to the tester battery. The first color, e.g. green, is emitted by the LED under this condition, since the average current under such a load is negative in nature as seen in the ignition wires. However, if the automobile's coil is connected with reverse polarity, the LED will emit the second color, e.g. red, indicating the improper connection.

The tester also checks for continuity, and if the LED does not light at all this indicates that the wire contacted by the probe point is a dead lead, neither grounded nor hot.

It is therefore among the objects of the invention to provide a low cost electrical tester particularly for automotive use, with a minimum of components in a single test circuit and with capability of testing voltage, polarity, continuity and high voltage ignition operation in the automobile. These and other objects, advantages, features and characteristics will be apparent from the following description of a preferred embodiment, considered along with the accompanying drawings.

DESCRIPTION OF THE DRAWINGS

FIG. 1 is an exterior view of a polarity and continuity testing device in accordance with the principles of the invention.

FIG. 2 is a partially schematic view showing the components of the tester of the invention within the housing, and indicating the manner of their connection in a circuit.

DESCRIPTION OF PREFERRED EMBODIMENT

Figure 3:
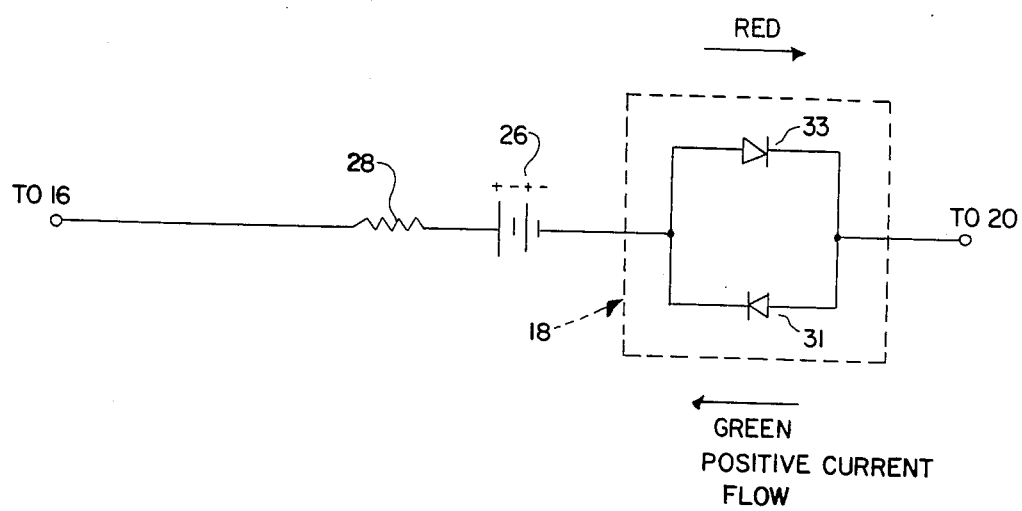
FIG. 3 is a schematic circuit diagram of the testing device.

FIG. 1 shows a polarity and continuity tester 10 in accordance with the invention having a generally pencil-shaped housing 11. At one end of the housing a plastic insulator 12 may be secured to the housing by use of machine threads 14, whereby the insulator may be unscrewed and removed to permit access to an internal battery (not shown in FIG. 1). Secured to the insulator, and capable of penetrating the insulative sleeve of a wire conductor, is a metal conductive point 16.

A multi-color light emitting diode or diode package 18, such as a tri-color diode exposed as a single light source 18, is affixed to and extends from the opposite end of the housing 11. A ground lead wire 20 extends from the side of housing 11 and is fitted at the opposite end with some suitable means for engaging ground on the automobile, such as an alligator clip 22 as shown in FIG. 1.

FIGS. 2 and 3 depict the circuitry of the testing device 10 as contained within the housing 11 shown in FIG. 1. The components are connected in a single series circuit and include the ground lead wire 20; the tri-color light emitting diode package 18; a conductor lead 24 connecting the diode to the negative end of a battery comprising, for example, two 1.5 volt dry cells 26 aligned end to end in series; a resistor 28 which may have a resistance in the range of approximately 450–550 ohms; and the metal conductive point 16.

As indicated in FIG. 2, the ground lead 20 may be fixed in conductive relationship to the housing 11, which in that event comprises a conductive metal shell. Connection of ground to the LED 18 is then accomplished by a ground connection lead 30 from the housing to one side of the LED.

FIG. 2 also shows a compression coil spring 32 which Q may be included in the assembly to electrically connect the battery 26 and the resistor 28, and to urge the series of electrical components together in good conducting relationship when the housing is screwed together with the plastic insulator 12 via the threads 14. Details of retention of the various components within the housing 11 and the insulator portion 12 are not shown in FIG. 2.

As shown in FIG. 3, the tri-color light emitting diode 18 may be of the type that comprises two light emitting diodes 31 and 33 in back-to-back parallel, each being adapted to emit a different color. For example, the LED 18, connected as shown, may emit the color green via the LED 31 when a current flow moves in a first direction as when originating from the potential of the tester battery 26. The diode or diode package 18, via the LED 33, will emit a second color, such as red, when the current flow is in a second, opposite direction and is in a relatively high voltage range (which may be, for example, about 5 to 12 volts).

When the ground lead 20 is connected to ground in a automobile by attaching the alligator clip 22, the polarity and continuity of positive and ground wires can be easily determined. When the metal conductive point makes contact with a ground lead, the current flow originating from the tester battery 26 will travel through the resistor 28, the conductive point and the automobile ground, thus reaching the ground lead 20 and finally passing through the diode 18 via its ground lead 30. The diode 18 (via the LED 31) will then emit the color green as a result of current flow being in the first direction.

If the conductive point 16, with the ground lead still attached to the automotive ground, contacts a hot lead of sufficiently high voltage, current will then flow in the second direction, opposite the first direction, under the influence of the automobile battery. The tester battery 26 will then function merely as a conductor permitting current to flow through the test probe 16, the resistor 28, the battery 26, and the diode 18 and then to ground, causing the LED 33 to emit a second color, e.g. red.

Should the conductive point 16 contact a purely DC hot lead in a low voltage range of about 1.5 to 5 volts, no color will be emitted due to the voltage drop of the LED and the presence of the battery 26 in the illustrated orientation. However, as explained above, the terminals of a coil may be checked with the engine running yielding mixed colors at low voltage (such as 3 volts) due to the presence of AC current.

Therefore, the tester as described above is capable of determining whether an automotive lead or other component is grounded or not; and if the lead is hot whether it is in a particular range of voltage within the 12-volt range of the automotive system. Further, using the same principles, continuity of a supposed hot lead—whether of relatively high or low voltage—but which is actually dead, may be discovered by the tester since the diode will fail to emit any color if no current is flowing. Likewise, when testing a known ground lead which has a break in continuity, the circuit will be open and no current will flow through the LED 18, either by the tester batteries or from the automobile battery.

A high voltage secondary circuit spark plug wire may also be tested using the tester 10 by contacting the spark wire with the conductive point 16 while the automobile's engine is running. Average ignition current is in the nature of a negative current flow, so that the current flow as sensed is in the first direction as described above, causing the diode to emit the first color green. If, however, the automobile's coil is connected with reverse polarity, the color red will be emitted.

The LED 18 may comprise, for example, a tri-color LED marketed by Radio Shack bearing the Model No. 276-035, including internal red and green diodes and being of the following specifications: Maximum continuous current 25 mA, peak current 1 Amp, power dissipation at 25° C. 115 mW; light output 1.8 mcd, peak wavelengths red at 697 nm, green at 565 nm; forward voltage drop at 10 mA=2.2 volts; dynamic resistance 25 ohm. When used with the three-volt battery shown, the resistor 28 should be in the range of 450–550 ohms, and a suitable resistor is a commonly available off-the-shelf resistor having a value of 470 ohms.

The above described preferred emodiment is intended to illustrate the principles of the invention, but not to limit its scope. Other embodiments and variations to this preferred embodiment will be apparent to those skilled in the art and may be made without departing from the scope of the invention as defined in the following claims.

I claim:
1. A testing device for determining continuity and polarity of a conductor in an automobile, comprising,
   a housing,
   a conductive point secured to and extending from one end of the housing, capable of penetrating an insulative sleeve of a wire conductor in the automobile,
   a ground wire extending from the housing,
   a tester battery within the housing,
   a resistor connected in series with the battery between the conductive point and the ground wire,
   a multi-color light emitting diode comprised of two back-to-back light emitting diodes of different colors, having two leads connected in series with the tester battery and the resistor between the conductive point and the ground, to the opposite end of the tester battery,
   the direct circuit from the conductive point through the tester battery, the resistor and the multi-color light emitting diode to the ground wire being the only conductive path through the testing device, without any bypass path around the battery regardless of current direction,
   the multi-color light emitting diode being of the type that will emit a first color when current flow is in a first direction, caused by tester battery voltage only and corresponding to both the ground wire and the conductive point being connected to ground in the automobile, and a second color when current flow through the diode is in the opposite direction, with current flowing in reverse through the tester battery, so that the tester battery acts as a conductor and not as a source of power.

2. The testing device of claim 1, wherein the first color is green, and the second color is red.

3. The testing device of claim 1, wherein the tester battery comprises two 1½ volt cells connected in series.

4. The testing device of claim 1, wherein tester battery has a voltage of 3 volts, with positive oriented toward the conductive point.

5. The testing device of claim 4, wherein the resistor has a resistance in the range of about 450 to 550 ohms.

6. The testing device of claim 1, wherein the tester battery has a voltage of about 3 volts with positive oriented toward the conductive point, for testing in an automobile with a 12-volt system, and wherein the resistor has a resistance of about 450 to 500 ohms.

7. The testing device of claim 1, wherein the multi-color light emitting diode is a tri-color LED and includes means for emitting said first color when current at substantially any voltage flows through the diode in said first direction, and for emitting said second color when current flows in said opposite direction in an upper range of voltage between about 5 and 12 volts.

8. The testing device of claim 1, including means associated with the multi-color light emitting diode for emitting the first color when the ground wire is connected to ground and the conductive point is in contact with a high-voltage spark wire of an automobile with its engine running.

9. A method for testing various conductors in an automobile to confirm continuity, polarity and proper function, comprising:
providing a testing device including a test circuit with a ground wire, a tri-color light emitting diode, a tester battery, a resistor and a conductive probe point connected in series and comprising the only conductive path through the testing device, the device being without any bypass path around the tester battery regardless of current direction through the tester,
connecting the ground wire to ground in the automobile,
touching the conductive probe point to a grounded wire in the automobile, to confirm ground, causing current to flow in a first direction due to the voltage of the tester battery and causing the light emitting diode to emit a first color,
touching the probe point to a first hot lead wire connected ultimately to the automobile battery positive, to confirm the hot lead, causing current to flow in an opposite direction through the tester circuit, using the tester battery as a conductor and not a source of power and causing the light emitting diode to emit a second color, and
touching the probe point to a high voltage spark wire with the automobile's engine running to confirm spark and proper coil orientation, causing current to flow in the first direction and causing the light emitting diode to emit the first color.

10. The method according to claim 9, further including touching the probe point to positive and negative primary circuit terminals of a coil of the automobile with the engine running, causing the light emitting diode to emit additional colors different from the first and second colors, due to the presence of AC, to confirm proper coil operation.

11. The method according to claim 9, wherein the tester battery is a 3 volt battery with positive oriented toward the conductive point probe.

12. The method according to claim 10, wherein the tester battery is a 3 volt battery with positive oriented toward the conductive point probe.

13. The method occurrent to claim 12, wherein the resistor has resistance of about 450 to 500 ohms.

* * * * *